United States Patent [19]

Chow et al.

[11] Patent Number: 5,757,242
[45] Date of Patent: May 26, 1998

[54] LOW POWER CONSUMPTION OSCILLATORS WITH OUTPUT LEVEL SHIFTERS

[75] Inventors: Hwang-Cherng Chow, Hsinchu; Tain-Shun Wu, Miou-Lee, both of Taiwan

[73] Assignee: Industrial Technology Research Institute, Hsinchu, Taiwan

[21] Appl. No.: 762,662

[22] Filed: Dec. 9, 1996

[51] Int. Cl.[6] .................. H03B 5/02; H03B 5/36
[52] U.S. Cl. .............. 331/57; 331/75; 331/109; 331/116 FE; 331/185; 327/333
[58] Field of Search ............ 331/74, 75, 116 FE, 331/57, 185, 109; 327/333

[56] References Cited

U.S. PATENT DOCUMENTS

| | | | |
|---|---|---|---|
| 4,990,847 | 2/1991 | Ishimaru et al. | 323/314 |
| 5,113,156 | 5/1992 | Mahabadi et al. | 331/75 |
| 5,115,434 | 5/1992 | Aizaki | 307/475 |
| 5,184,094 | 2/1993 | Kohler | 331/158 |
| 5,483,205 | 1/1996 | Kawamura | 331/74 |
| 5,486,795 | 1/1996 | Spence et al. | 331/116 FE |

*Primary Examiner*—Siegfried H. Grimm
*Attorney, Agent, or Firm*—Meltzer, Lippe, Goldstein, Wolf, & Schlissel, P.C.

[57] ABSTRACT

A low power consumption oscillator circuit is provided with an oscillator. The oscillator responds to a voltage by producing an oscillating signal at its output having an amplitude that depends on the level of the voltage. Furthermore, the low power consumption oscillator circuit has a level shifter. Illustratively, according to one embodiment, the level shifter includes a pull-up driver and a pull-down driver connected in parallel between the oscillator output and an output of the level shifter. The pull-up driver is configured so as to refrain from conducting current between a biasing input of the pull-up driver and the level shifter output simultaneously with the pull-down driver when the oscillating signal exceeds a certain voltage level. The level shifter illustratively includes an intrinsic PMOS device.

17 Claims, 8 Drawing Sheets

LOW POWER CONSUMPTION OSCILLATORS WITH OUTPUT LEVEL SHIFTERS

RELATED APPLICATION

The subject matter of this application is related to the subject matter of the following patent application:

(1) U.S. patent application Ser. No. 08/762,667, entitled "Level Shifting Interface Circuit with Intrinsic Pull-up Device," filed on even date herewith for Hwang-Cherng Chow.

The above-listed patent application is commonly assigned to the assignee of this application and is incorporated herein by reference.

FIELD OF THE INVENTION

The present invention pertains to oscillator circuits, such as those used in integrated circuit chips.

BACKGROUND OF THE INVENTION

Figure 1:
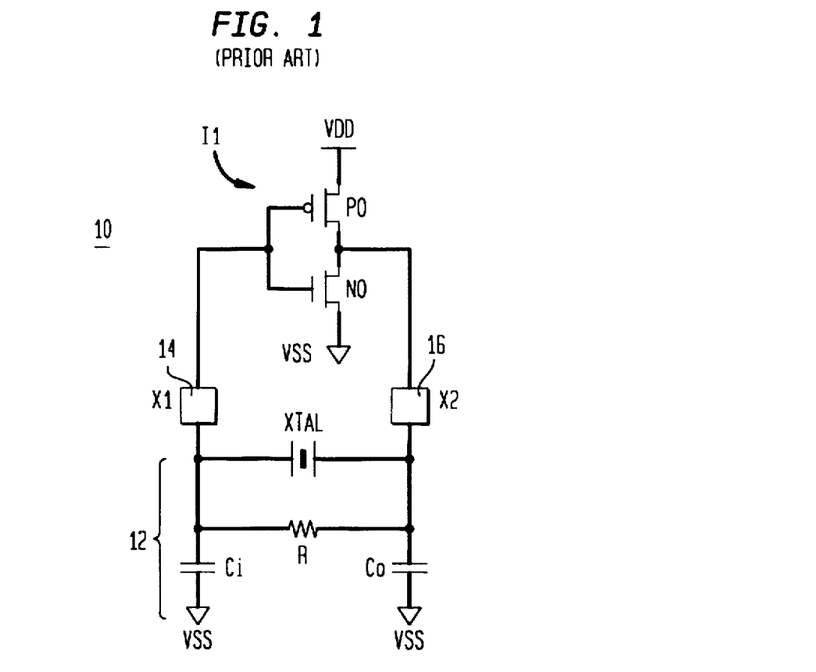
FIG. 1 shows a first conventional oscillator.

FIG. 1 shows a conventional Pierce oscillator 10. The Pierce oscillator 10 includes an inverter I1, formed by push-pull connected MOS transistors P0 and N0. (Herein, the term MOS is used, as is conventional, to refer to insulated gate field effect devices of various types and should not be restricted to metal oxide semiconductor field effect devices.) That is, the source of the PMOS transistor P0 is connected to a high biasing voltage supply bus $V_{DD}$, where $V_{DD}$ is, e.g., 5 volts. The source of the NMOS transistor N0 is connected to a low biasing voltage supply bus $V_{SS}$, where $V_{SS}$ is, e.g., 0 volts. The drains of the PMOS transistor P0 and the NMOS transistor N0 are commonly connected and serve as the output of I1. The gates of the PMOS transistor P0 and the NMOS transistor N0 are commonly connected and serve as the input of I1. The Pierce oscillator 10 also includes a resonant circuit 12 connected between the input and the output of the inverter I1. The resonant circuit 12 includes a crystal XTAL connected between the input and output of I1, a resistor R connected in parallel to XTAL, an input capacitor Ci connected between the input of I1 and $V_{SS}$ and an output capacitor Co connected between the output of I1 and $V_{SS}$. Illustratively, the oscillator 10 is designed such that the inverter I1 is incorporated internally into the integrated circuit chip in which it is used. The resonant circuit 12, however, is typically connected externally to the integrated circuit chip via pads 14 and 16. This is done for two reasons. First, the components of the resonant circuit 12 are relatively large and, if incorporated into the integrated circuit chip, would occupy a large amount of precious space. Second, the oscillating frequency of the oscillator is fixed by the components used in the resonant circuit 12, most notably by XTAL. By providing an external connection architecture, different oscillating frequencies can be achieved by suitable selection of the components (in particular, XTAL) in the resonant circuit 12. In operation, an oscillating signal is produced at both terminals X1 and X2 having a frequency which depends mostly on the choice of XTAL. Either X1 or X2 can be used as the output of the oscillator 10.

The power dissipated by the oscillator 10 is proportional to the frequency of the oscillating signal, the capacitance of Ci and Co and the square of the voltage across XTAL (from X1 and X2). It is desirable to reduce the amount of power dissipated by the oscillator 10, for example, to reduce battery power consumption in portable electronic devices that may use oscillator 10 for generating a clock or timing signal. The selection of operating frequency is generally fixed by the particular application in which the oscillator 10 is used, e.g., to produce a clock signal of a specified oscillating frequency. Thus, conventional voltage reduction techniques have focused on reducing the power applied across XTAL.

Figure 2:
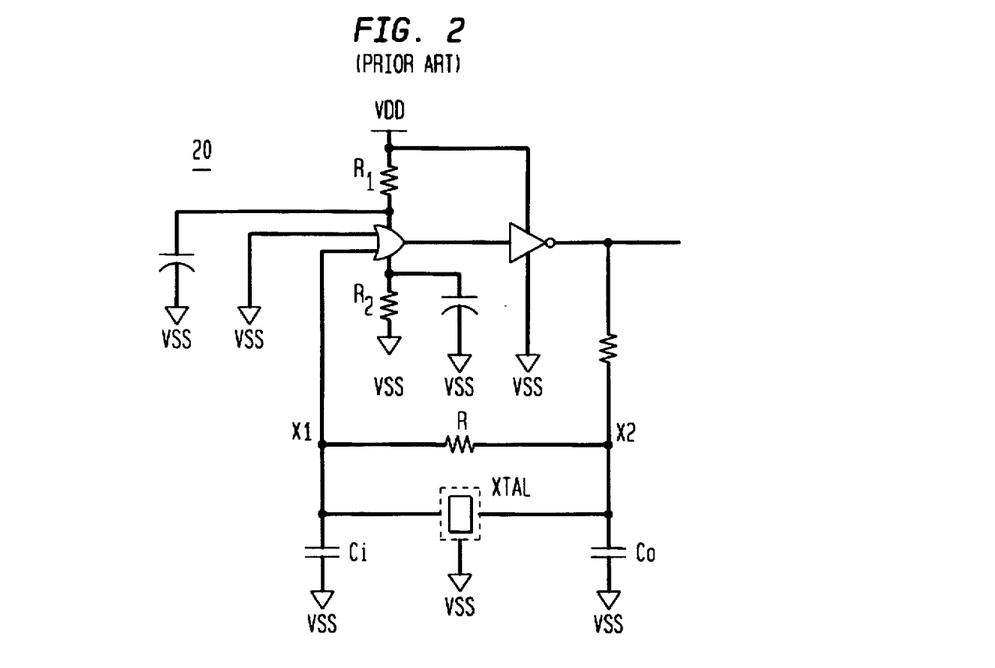
FIG. 2 shows a second conventional oscillator.

FIG. 2 shows an oscillator 20 according to U.S. Pat. No. 5,184,094. In this circuit 20, resistor R1 is connected in series between the high voltage bus and the high voltage biasing input of an OR circuit which receives the output of the resonant circuit. Likewise, a resistor R2 is connected in series between the low voltage bus and the low voltage biasing input of the OR circuit. The resistor R1 reduces the level of the high biasing voltage, and the resistor R2 raises the level of the low biasing voltage, provided to the OR circuit. This, in turn, reduces the voltage applied across XTAL as well as the peak amplitude of the signal produced at X1 and X2. Since the voltage applied across XTAL is reduced, the oscillator dissipates less power. However, the oscillator 20 has two disadvantages. First, large resistors R1 and R2 are needed to achieve the reduction in power. Such large resistors are difficult to implement within the integrated circuit chip (i.e., would occupy a large amount of space). Second, the signal produced at the output has a d.c. component. This occurs because the transistors of the OR circuit and inverter have different driving capacities and thus the voltage outputted from the OR circuit is always slightly lower than $V_{DD}$ or higher than $V_{SS}$. See U.S. Pat. No. 5,115,434. The d.c. component of the oscillating signal provides no useful benefit and merely increases the power dissipated within the integrated circuit chip. Thus, minimal power dissipation is not achieved.

Figure 3:
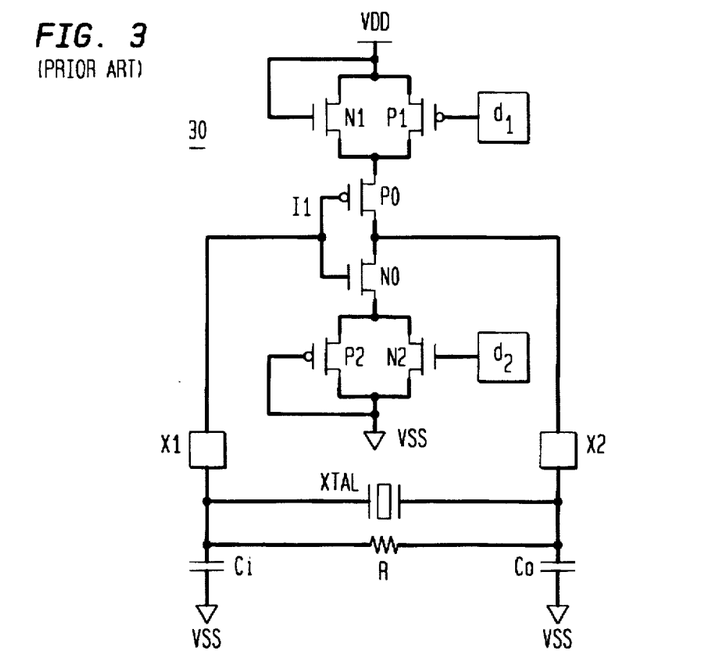
FIG. 3 shows a third conventional oscillator.

FIG. 3 shows an oscillator circuit 30 disclosed in U.S. Pat. No. 5,486,795. In this circuit 30, transistors R1 and R2 are replaced by diode connected MOS transistors N1 and P2 for purposes of lowering the high voltage inputted to the high voltage biasing input of inverter I1 and raising the low voltage inputted to the low voltage biasing input of inverter I1. (Transistors P1 and N2 and delay elements d1 and d2 are provided as switches for starting up the oscillator.) This circuit 30 overcomes the problem of incorporating the biasing voltage adjustment elements within the integrated circuit chip. However, the output oscillating signal still has a d.c. component and thus minimal power dissipation is still not achieved.

Figure 4:
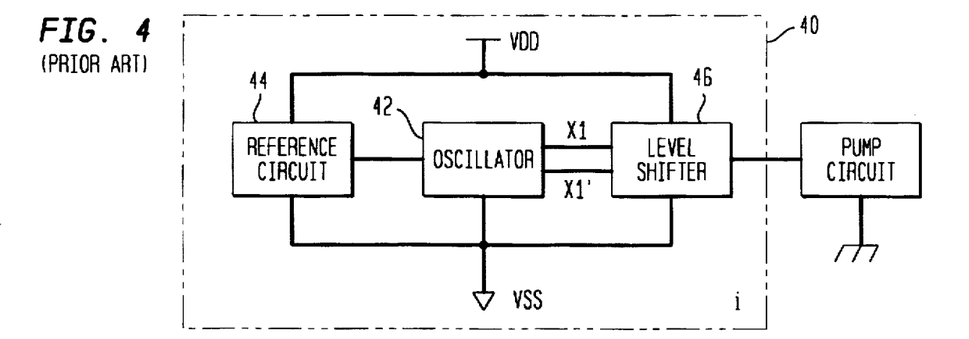
FIG. 4 shows a fourth conventional oscillator.

FIG. 4 shows an oscillator circuit 40 according to U.S. Pat. No. 5,483,205. The oscillator circuit 40 includes an oscillator 42 (e.g., inverter and resonant circuit) that can be constructed similarly as shown in FIG. 1. A reference circuit 44 is provided for reducing the voltage level of the high biasing voltage input to the oscillator 42. Thus, the amplitude of the oscillating signal is reduced thereby reducing the power dissipated by the circuit 40. The oscillator 42 outputs both the output signal at X1 and its complement X1' to a level shifter 46. The level shifter 46 shifts the amplitude of the voltage of the oscillating signal to approximately the range of $V_{SS}$ to $V_{DD}$. The level shifted signal is received at a pump circuit.

Figure 5:
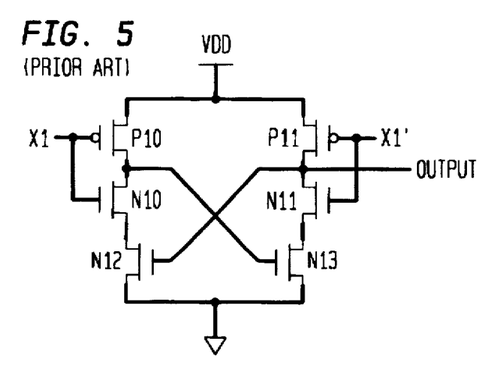
FIG. 5 shows a first conventional level shifter.

FIG. 5 shows the level shifter 46 in greater detail. The operation of this level shifter 46 is disclosed in U.S. Pat. No. 5,483,205 and is therefore only briefly described herein. Assume first that X1 is at a low voltage level and X1' is at a high voltage level. With X1 at a low voltage level, P10 is turned on. Thus, the drain of P10 charges up to $V_{DD}$. This voltage level (which is $V_{DD}$) is applied to the gate of transistor N13 which turns on. As such, transistor N13 drives its drain to the voltage $V_{SS}$. The voltage X1' being at a high level turns off P11 and turns on N11. Thus, N11 tends to drive its drain (also the output of the level shifter 46) to $V_{SS}$. The voltage level at the drain of N11 is fed to the transistor N12 which turns off, thereby allowing the voltage at the source of N10 to float.

Consider now the case where X1 is at a high voltage level and X1' is at a low voltage level. With X1' at a low voltage level, transistor P11 turns on. As such, P11 tends to drive its drain up to $V_{DD}$. The voltage at the drain of P11 is fed to the gate of transistor N12 which turns on. The transistor N12 thus drives its drain to $V_{SS}$. This low $V_{SS}$ voltage is applied to the source of transistor N10. With X1 at a high voltage level, P10 turns off and N10 turns on. Thus, N10 tends to drive its drain to the same voltage applied to the source of N10, namely, $V_{SS}$. The low $V_{SS}$ voltage at the drain of transistor N10 is fed to the gate of transistor N13 which thus turns off. As such, the voltage at the drain of N13 (the source of N11) is left floating. The output voltage is therefore a high voltage near $V_{DD}$.

Figure 6:
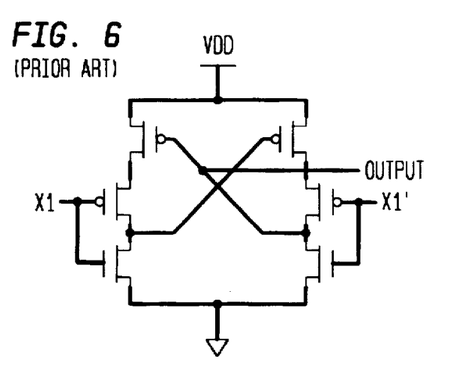
FIG. 6 shows a second conventional level shifter.

FIG. 6 shows another level shifter embodiment. This level shifter embodiment functions in an analogous fashion. The discussion of its operation is therefore omitted.

The use of the level shifting circuit (FIG. 6) solves the d.c. leakage problem. However, in order to implement the disclosed level shifter, both the oscillator 42 output signal X1, and its complement X1' are needed. Besides, a total of six MOS transistors (two PMOS and four NMOS transistors in FIG. 5 or four PMOS and two NMOS transistors in FIG. 6) are required to implement the level shifter. Note also that the NMOS and PMOS transistors of the circuits shown in FIGS. 5 and 6 still have different driving capacities. As such, a delay occurs in transitioning the output of the level shifter 46 with the variation in voltage level of the oscillating signal. This limits the oscillator frequency that can be accommodated by the circuit 40 to lower frequencies.

It is an object of the present invention to overcome the disadvantages of the prior art.

SUMMARY OF THE INVENTION

These and other objects are achieved according to the present invention. According to one embodiment, a low power consumption oscillator circuit illustratively may be provided with a reference circuit. The reference circuit responds to a first voltage by producing a second voltage having a level that is lower than the level of the first voltage. The low power consumption oscillator circuit has an oscillator. The oscillator responds to the second voltage by producing an oscillating signal at its output having an amplitude that depends on the level of the second voltage. Furthermore, the low power consumption oscillator circuit has a level shifter. Illustratively, according to one embodiment, the level shifter includes a pull-up driver and a pull-down driver connected in parallel between the oscillator output and an output of the level shifter. The pull-up driver is configured so as to refrain from conducting current between a biasing input of the pull-up driver and the level shifter output simultaneously with the pull-down driver when the oscillating signal exceeds a certain voltage level.

According to another embodiment, a low power consumption oscillator circuit is provided with an oscillator and a level shifter. The oscillator is similar to that described above. The level shifter illustratively includes an intrinsic PMOS device. Illustratively, a reference circuit may also be provided.

According to yet another embodiment, a ring oscillator is provided with a delay element that can be formed as a plurality of series connected inverters. The delay element has a high biasing voltage input receiving a first voltage. A first two-input logic gate is provided having a high biasing voltage input that receives the first voltage. The first two-input logic gate receives an enable signal as a first input and an output of the delay element fed back as a second input. The first two-input logic gate has an output connected to an input of the delay element. The ring oscillator also has a second two-input logic gate having a high biasing voltage input receiving a second voltage having a level that is higher than the level of the first voltage. The second two-input logic gate receives the output of the delay element as a first input and a second enable signal as a second input. An inverter illustratively may be connected to an output of the second two-input logic gate. The inverter has a high biasing voltage input receiving the second voltage.

In short, a low power consumption oscillator circuit is provided which minimizes the dissipated power yet is simple. The inventive low power consumption oscillator circuit requires only a single oscillator output—no complementary output is needed to perform the requisite level shifting. Furthermore, the operating frequency of the low power consumption oscillator circuit is increased over conventional architectures.

DETAILED DESCRIPTION OF THE INVENTION

Figure 7:
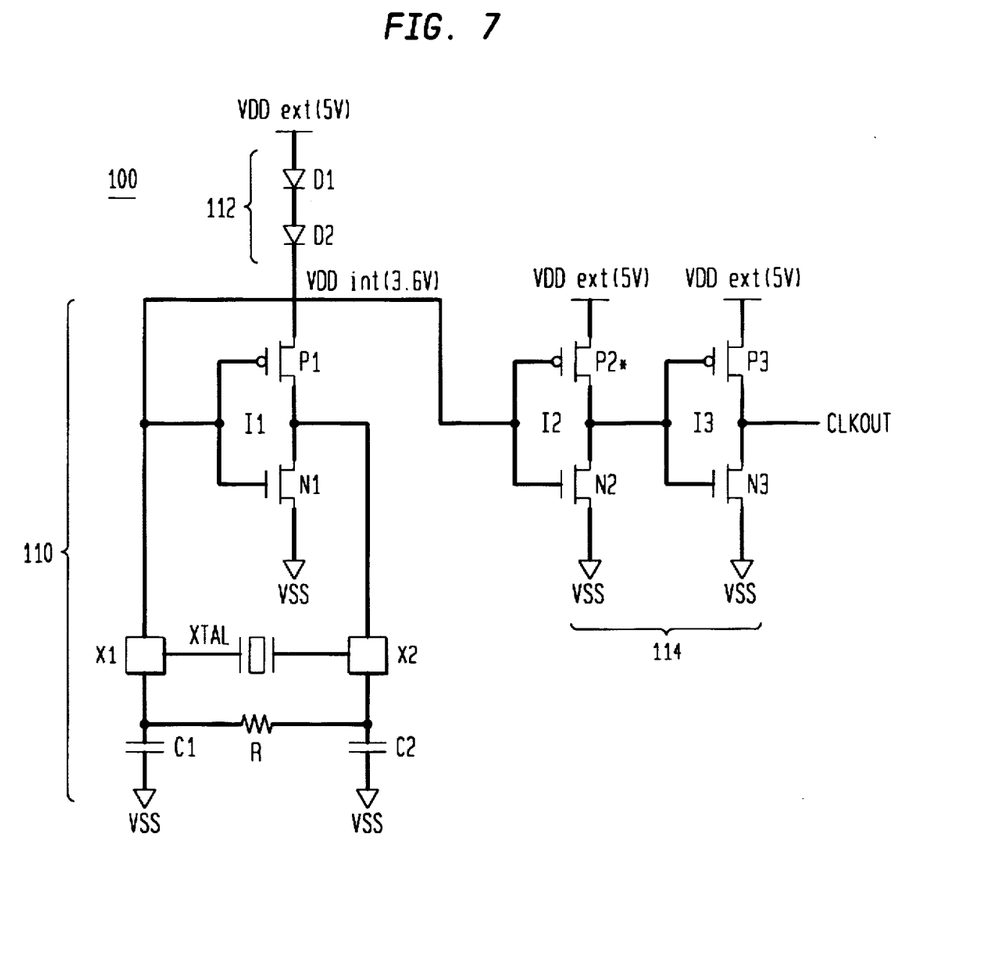
FIG. 7 shows an oscillator circuit according to a first embodiment of the present invention.

FIG. 7 shows a low power consumption oscillator circuit 100 according to an embodiment of the present invention. The oscillator circuit 100 illustratively is shown in a clock generator application, although this is merely illustrative. As shown, the oscillator circuit 100 includes an oscillator 110 having a similar construction as the oscillator 10 of FIG. 1. The oscillator circuit 100 also has a reference voltage circuit 112 connected between a first high voltage level voltage $V_{DDext}$ and a high voltage biasing input $V_{DDint}$ of the inverter I1 of the oscillator 110. The oscillator circuit 100 also has a level shifter circuit 114 which is connected in series between the output of the oscillator 110 and the output of the oscillator circuit 100 CLKOUT.

Illustratively, the reference voltage circuit is shown as formed by a series connection of one or more forward biased diodes D1 and D2. As is well known, forward conducting Si diodes D1–D2 each produce approximately a 0.7 volt drop.

Thus, if the voltage level of $V_{DDext}$ is 5 volts, the voltage produced at the output of D2 has a voltage of approximately 3.6 volts. As noted above, by reducing the high biasing voltage applied to the inverter I1, the voltage applied across the XTAL is reduced and the peak amplitude voltage of the oscillating signal produced at the oscillator 110 output X1 is reduced. This in turn dramatically lowers the power dissipated in the oscillator 110 and the oscillator circuit 100 overall.

The level shifter 114 is shown as formed by two series connected inverters I2 and I3. The inverter I2 receives the oscillator 110 output X1 at its input and outputs a level shifted, inverted oscillated signal to the inverter I3. The inverter I3 receives the inverted, level-shifted oscillated signal and inverts it, so as to output at CLKOUT the level shifted, non-inverted oscillating signal. As shown, each of the inverters I2 and I3 receives the voltage $V_{DDext}$ at its high voltage biasing input and the low voltage $V_{SS}$ at its low voltage biasing input.

Note that the level shifter 114 receives only the outputted oscillating signal from X1 and does not require the complement of this signal to perform the level shifting. Level shifters which level shift an inputted signal using only the inputted signal, and not the complement of that signal, are known in the prior art. See U.S. Pat. No. 5,115,434 and co-pending U.S. patent application Ser. No. 08/762,667, entitled "Level Shifting Interface Circuit with Intrinsic Pull-up Device" incorporated by reference herein. However, such conventional single input level shifters tend to introduce a d.c. component into the level shifted output signal. Despite not utilizing the complement of the oscillating signal to perform the level shift, the level shifter 114 is capable of suppressing a d.c. component that might otherwise be introduced into the output signal. This is achieved according to the specific construction of the level shifter 114 which is described in greater detail in co-pending U.S. patent application Ser. No. 08/762,667, entitled "Level Shifting Interface Circuit with Intrinsic Pull-up Device" incorporated by reference herein. In particular, the inverter I2 includes MOS transistors P2* and N2 connected in a push-pull configuration, where transistor P2* is an "intrinsic" PMOS transistor. That is, unlike an ordinary PMOS transistor, no channel implantation step is performed on the channel of the intrinsic PMOS transistor P2* in its fabrication. The intrinsic PMOS transistor P2* therefore has an intrinsic channel for which no threshold voltage adjustment has been performed. In a twin-well CMOS process semiconductor, the threshold voltage of an intrinsic PMOS transistor P2* is approximately −2 volts. Note that fabrication of the intrinsic transistor P2* requires no additional mask layers or photolithographic steps.

Consider now the impact of the intrinsic PMOS transistor P2* on the operation of the level shifter I2. The oscillating signal outputted from X1 has a peak amplitude of 3.6 volts. When the oscillating signal is a high level voltage, i.e., at about 3.6 volts, the gate-to-source voltage of the intrinsic PMOS transistor P2* will be −1.4 volts (i.e., the voltage of the gate is 3.6 volts and the voltage at the source is 5 volts). Since the threshold turn on voltage of the intrinsic MOS device is much lower, i.e., −2 volts, the intrinsic PMOS transistor P2* is off and no conducting path is formed between the source and the drain of P2*. During this situation, only the NMOS transistor N2 is on and drives the output. In fact, assuming that the threshold voltage of the intrinsic PMOS transistor P2* is −2 volts, the intrinsic PMOS transistor will be off whenever the oscillating signal voltage level exceeds 3.0 volts. This is desirable since only the NMOS transistor should drive the output of the inverter I2 when the oscillating signal voltage level is that high. The net effect is that the NMOS transistor N2 can drive the output of the inverter I2 all the way down to $V_{SS}$ even though the input signal never exceeds $V_{DDint}$. Since the output of the inverter I2 is driven entirely within the range of $V_{SS}$ to $V_{DDext}$ there is no d.c. component impressed on the output signal of the inverter I2. The inverter I3 then inverts the inverted, level shifted oscillating signal so that it has the same polarity as the inputted oscillating signal. The inverter I3 can thus be formed with ordinary MOS devices N3 and P3.

Note that in the circuit 100, the speed of operation can be increased by increasing the size of P2* relative to N2. As is known, NMOS devices have higher carrier mobility and therefore can achieve a higher current drive for a given size than PMOS devices. However, it is desirable to match the current driving capabilities of P2* and N2 so as to equalize (as much as possible) the charging and discharging times of the output. By equalizing the charging and discharging times, the transient delay in switching the output of the inverter I2 are minimized thereby increasing the operating frequency, i.e., the frequency of the inputted oscillating signal that can be level shifted using the level shifter 114.

Note that while the reference voltage circuit 112 is shown as formed by two diodes, the reference voltage circuit can also be formed with a different number of diodes to achieve different levels for the voltage $V_{DDint}$. For instance, three diodes can be used to reduce the voltage to about 2.9 volts. However, the crystal XTAL may require a certain threshold biasing voltage of, for example, 2.5 volts to properly operate. In such a case, no more than three diodes should be used in the reference voltage circuit 112. Note also that the oscillator circuit can be used with other voltage levels for $V_{DDext}$. For instance, if $V_{DDext}$ is 3.3 volts, then the reference voltage circuit 112 can be formed with a single diode to reduce $V_{DDint}$ to 2.6 volts.

Figure 8:
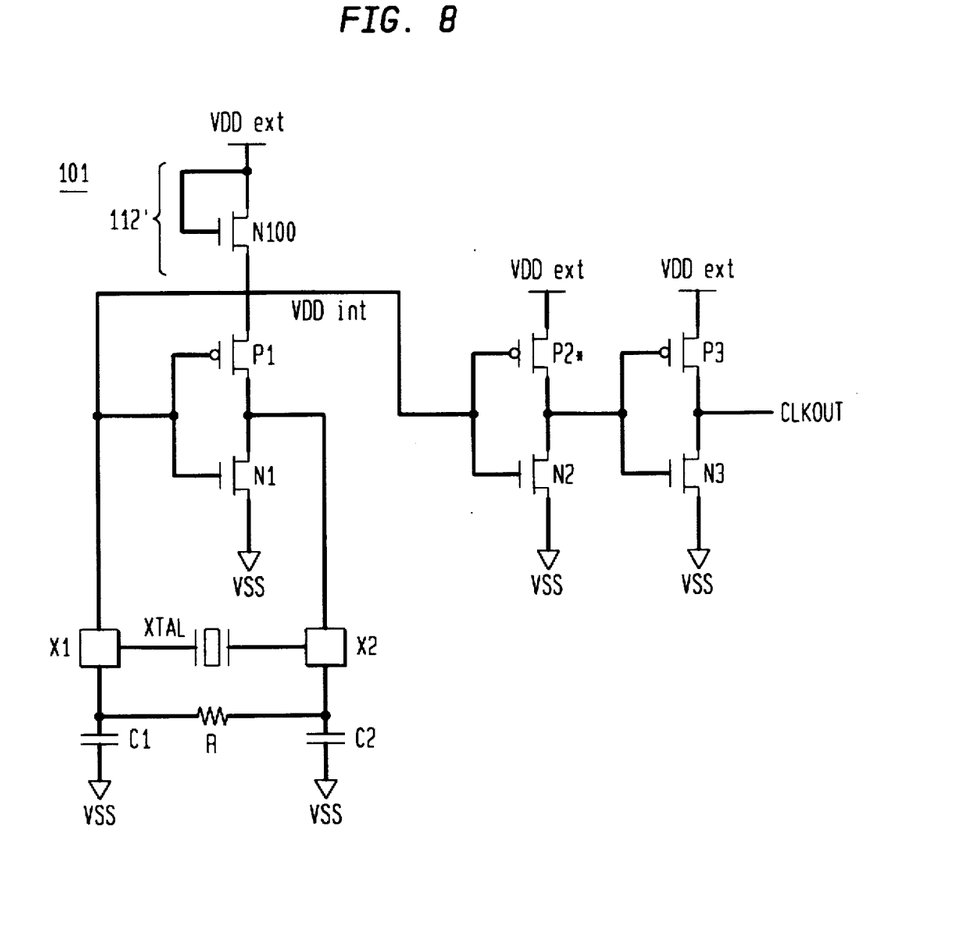
FIG. 8 shows an oscillator circuit according to a second embodiment of the present invention.
Figure 9:
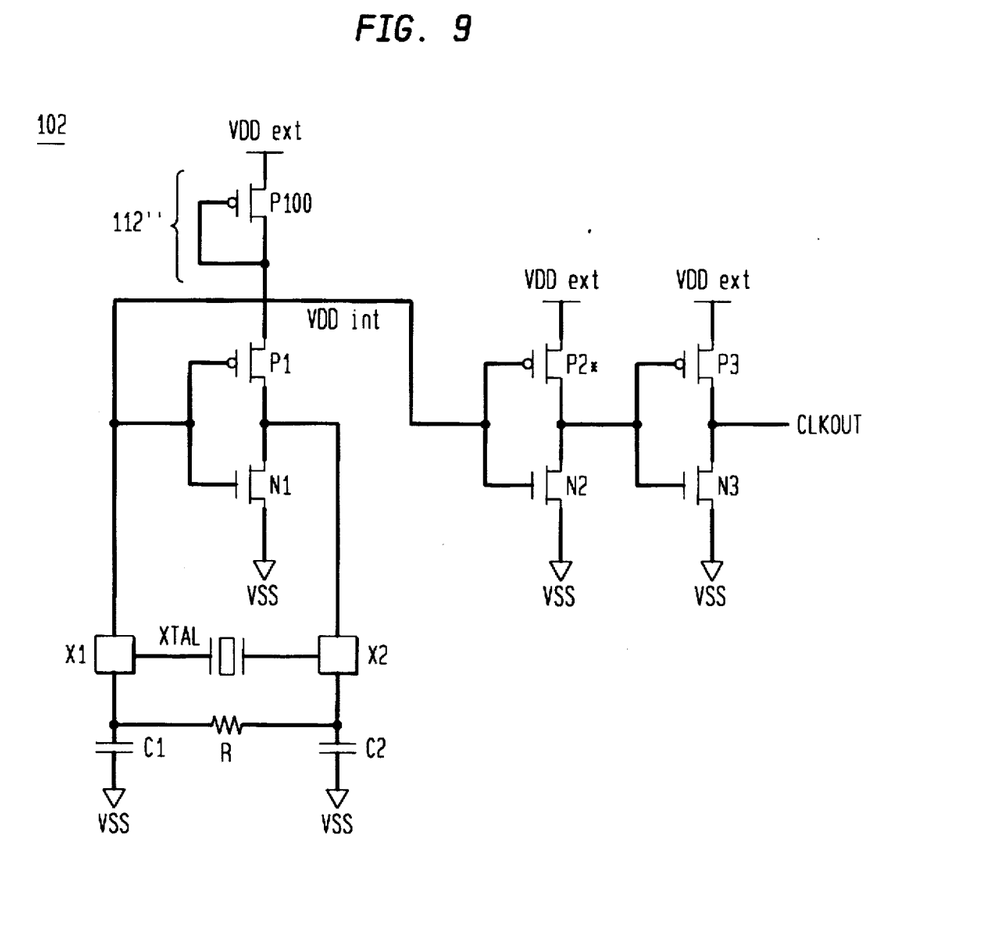
FIG. 9 shows an oscillator circuit according to a third embodiment of the present invention.

FIG. 8 shows another embodiment of the low power consumption oscillator circuit 101. In the circuit 101, the voltage reference circuit 112' is formed by a diode connected NMOS transistor N100. As shown, the transistor N100 has its gate connected to its drain. Because of the well-known body effect, the voltage drop across the diode connected transistor N100 is approximately 1.5 volts so that $V_{DDint}$ is about 3.5 volts if $V_{DDext}$ is 5 volts. If $V_{DDext}$ is 3.3 volts, the reference circuit 112' produces a $V_{DDint}$ of about 2.3 volts. FIG. 9 shows a similar oscillator circuit 102 with a reference voltage circuit 112" formed using a single diode connected PMOS transistor P100. The gate of PMOS transistor P100 is connected to its drain.

Figure 10:
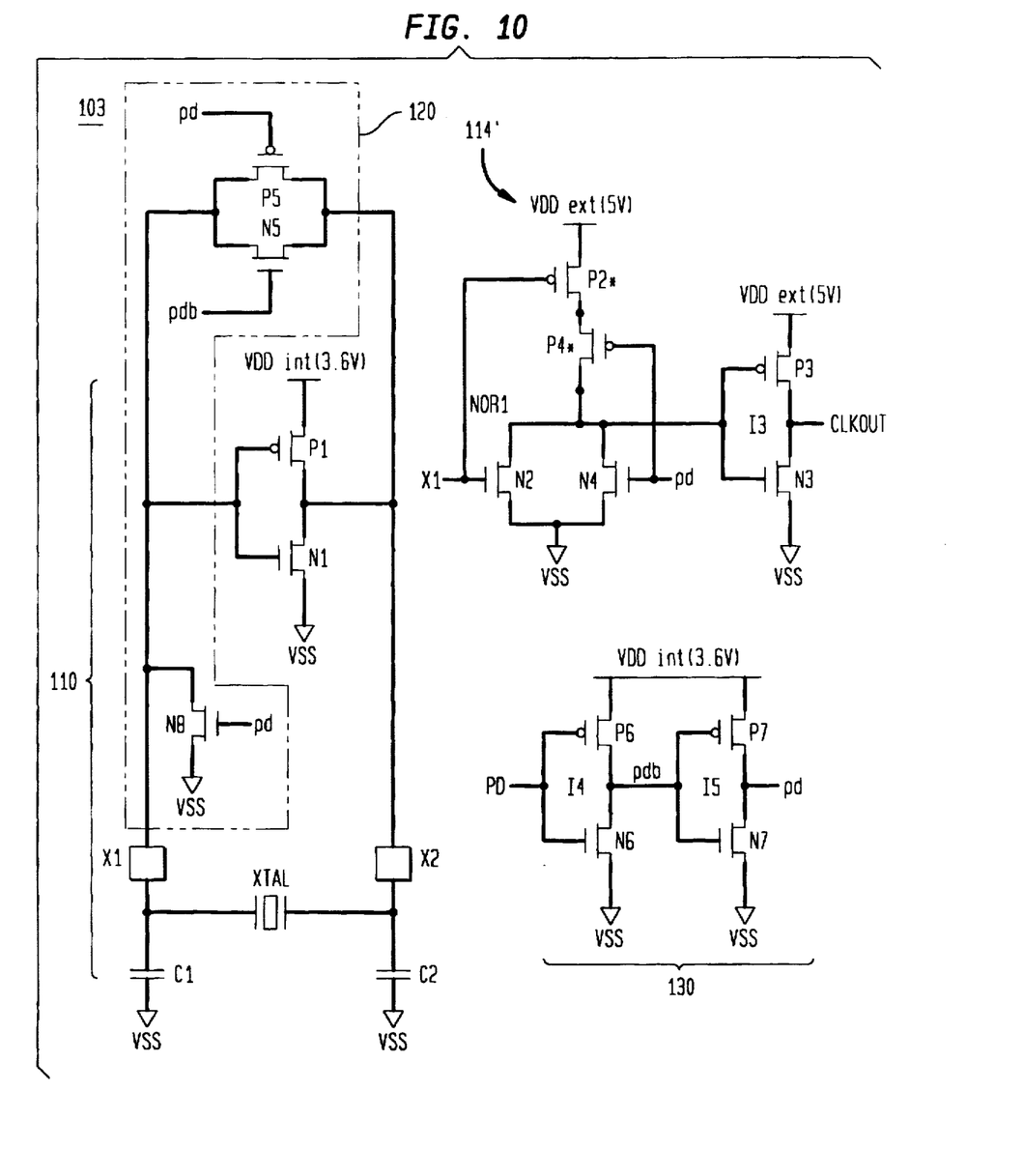
FIG. 10 shows an oscillator circuit according to a fourth embodiment of the present invention.

FIG. 10 shows yet another embodiment of a low power dissipation oscillator circuit 103. As before, the circuit 103 has an oscillator 110, a reference voltage circuit (not shown) and a level shifter 114' with intrinsic MOS device (described in greater detail below) In the circuit 103, the reference voltage circuit 112 has been omitted from the drawing for sake of clarity.

The circuit 103 also has enable circuitry 120 and a control signal generating circuit 130. The enable circuitry 120 includes a PMOS transistor P5 and an NMOS transistor N5 connected in a transmission gate configuration, i.e., having their drains commonly connected and their sources commonly connected. The transmission gates are connected across the output X1 and the feedback input X2. The PMOS transistor P5 receives a control signal pd and the NMOS transistor receives a complement of this control signal pdb.

The enable circuitry also includes a MOS transistor, e.g., an NMOS transistor N8 having a drain connected to the output X1 and a source connected to the low biasing voltage $V_{SS}$ (0 volts). The gate of the transistor N8 receives the control signal pd.

The operation of the enable circuitry is as follows. When pd is a high level voltage ($V_{DDint}$) and pdb is a low level voltage ($V_{SS}$), the transmission gates are off—no conduction path is created between the output X1 and the feedback input X2. In this state, a large resistance is produced between X1 and X2. Likewise, the transistor N8 is on and a conduction path is created between X1 and the $V_{SS}$ bus so that N8 drives X1 to $V_{SS}$. As such, the voltage at the output X1 is forced to $V_{SS}$ and the resistance of the transmission gates P5 and N5 is too high for the voltage applied across XTAL to oscillate. The oscillating signal is therefore disabled. On the other hand, when pd is a low level voltage ($V_{SS}$) and pdb is a high level voltage ($V_{DDint}$), the transmission gates P5 and N5 are both on and a resistive conducting path is formed between X1 and X2. Thus, a resistance is formed between the two nodes X1 and X2 thereby enabling the voltage applied across XTAL to oscillate. Furthermore, the transistor N8 is off so N8 does not drive X1 to $V_{SS}$. The oscillator 110 is therefore enabled.

The circuit 130 generates the signals pd and pdb from an enable signal PD, which may be generated by another circuit on the same integrated circuit chip or may be externally supplied. The oscillator 103 may be disabled for a number of reasons, such as to place the integrated circuit into a "sleep mode" of low power dissipation when it is idle. The signal PD, which may be $V_{DDext}$ or $V_{SS}$ is received at a first inverter I4. The inverter I4 is formed by transistors P6 and N6 in a push-pull configuration. The source of transistor P6 receives the $V_{DDint}$ voltage as a high voltage biasing input. (The source of the transistor N6 receives the voltage $V_{SS}$ as a low voltage biasing input.) Therefore, the control signal pdb produced at the output of the inverter I4 is $V_{DDint}$ or $V_{SS}$. The control signal pdb thus produced is outputted to the enable circuitry 120 and also outputted to the second inverter I5. The inverter I5 is formed by transistors P7 and N7 connected in a push-pull configuration. Like the inverter I4, the inverter I5 receives the voltage $V_{DDint}$ as a high biasing voltage. Thus, the control signal pd produced at the output of inverter I5 is $V_{DDint}$ or $V_{SS}$. The control signal pd thus produced is also outputted to the enable circuitry 120.

The level shifter 114' has a slightly different configuration than the level shifter 114 of FIGS. 7, 8 and 9. Instead of the inverter I2, a two-input NOR gate NOR1 is provided. The NOR gate NOR1 includes a first intrinsic PMOS transistor P2* whose source receives $V_{DDext}$ as a high voltage biasing input voltage of the NOR gate NOR1, and its gate connected to the oscillator output X1. A second intrinsic PMOS transistor P4* has a source connected to the drain of P2*, and a gate receiving the control signal pd. Two NMOS transistors N2 and N4 are also provided. Each transistor N2 and N4 has a source commonly receiving $V_{SS}$, as a low voltage biasing input of the NOR gate NOR1, and a drain commonly connected to the drain of the intrinsic PMOS transistor P4*. The NMOS transistor N2 has a gate connected to the oscillator 110 output X1. The NMOS transistor N4 has a gate receiving the control signal pd. The common connection of the drains of the transistors N2 and N4 and P4* serves as the output of the NOR gate NOR1.

In operation, assume first that pd is the high voltage $V_{DDint}$. In such a case, the transistor P4* is off because the gate to source voltage does not exceed the threshold turn on voltage of P4*. Thus, no conduction path is formed from the drain of P2* to the output of the NOR gate NOR1. On the other hand, the transistor N4 is on and drives the output of the NOR gate NOR1 to $V_{SS}$. As such, the NOR gate NOR1 outputs the low voltage $V_{SS}$, regardless of the voltage of the oscillating signal outputted from X1.

Assume now that pd is the low voltage $V_{SS}$. In such a case P4* is on and a conducting path is formed between the drain of P2* and the NOR gate NOR1 output. Furthermore, N4 is off and no conduction path is formed between N4 and the $V_{SS}$ bus. When the voltage level of the oscillating signal outputted from X1 is a high level voltage $V_{DDint}$, in particular, when the difference between $V_{DDext}$ and the oscillating signal voltage is greater than the threshold voltage of the transistor P2* (e.g., 3 volts or higher when $V_{DDext}$=5 volts, $V_{DDint}$=3.6 volts and $V_{threshold}$ of P2* is −2 V), the transistor P2* is completely turned off. Thus, the output of the NOR gate NOR1 is driven entirely by the transistor N2. Because the oscillating signal outputted form X1 is the high voltage $V_{DDint}$, the transistor N2 is on and drives the output of the NOR gate NOR1 to $V_{SS}$. When the voltage level of the oscillating signal outputted from X1 is the low voltage $V_{SS}$, the transistor N2 is off and no conduction path is formed between $V_{SS}$ and the output of the NOR gate NOR1. On the other hand, the transistor P2* is on and a conduction path is formed from the $V_{DDext}$ bus to the output of the NOR gate NOR1 (via transistor P4*). The voltage of the signal outputted from the NOR gate is exactly $V_{DDext}$. Thus, when pd is at a low voltage level, the NOR gate NOR1 effectively functions as an inverter. P2* serves as a pull-up driver and N2 serves as a pull-down driver.

Note that the size of transistors P2* and N2 may be adjusted to enable higher oscillator frequency operation.

Figure 11:
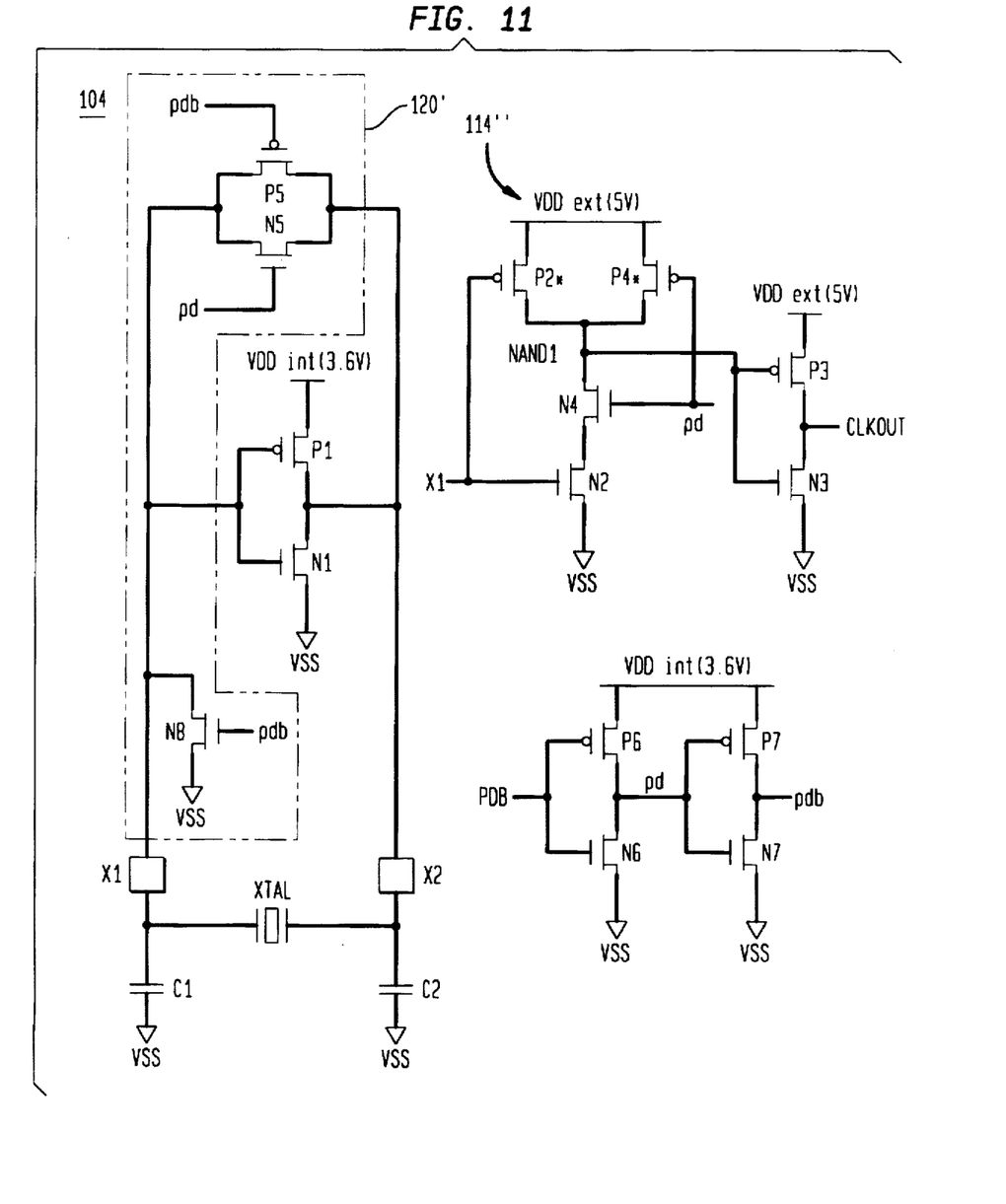
FIG. 11 shows an oscillator circuit according to a fifth embodiment of the present invention.

FIG. 11 shows another embodiment of an oscillator circuit 104. The oscillator circuit 104 is very similar to the oscillator circuit 103 and therefore only the differences between these two circuits are discussed. First, in the enable circuitry 120', the transistors P5 and N8 receive the signal pdb and the transistor N5 receives the signal pd. Thus, the oscillator 110 is disabled when pdb is the high voltage $V_{DDint}$ and pd is the low voltage $V_{SS}$. Likewise, when pdb is the low voltage $V_{SS}$ and pd is the high voltage $V_{DDint}$, the oscillator 110 is enabled.

The level shifter circuit 114" has a two-input NAND gate NAND1. The NAND gate NAND1 includes two intrinsic PMOS transistors P2* and P4* which have their sources commonly receiving $V_{DDext}$ as a high biasing voltage input of the NAND gate NAND1 and their drains commonly connected to the output of the NAND gate NAND1. The transistor P2* receives the oscillating signal outputted from X1 at its gate. The transistor P4* receives the control signal pd at its gate. The NAND gate NAND1 has an NMOS transistor N4 which has its drain connected to the output of the NAND gate NAND1. The transistor N4 receives the control signal pd at its gate. The NAND gate NAND1 furthermore has a second NMOS transistor N2. The NMOS transistor has its source receiving $V_{SS}$, its drain connected to the source of transistor N4 and its gate connected to the oscillator output X1.

In operation, when pd is a low voltage (e.g., $V_{SS}$), transistor P4* is on (providing a conduction path from the $V_{DDext}$ bus to the output of the NAND gate NAND1) and transistor N4 is off (preventing a conduction path from forming between the $V_{SS}$ bus and the output of the NAND gate NAND1). Therefore, regardless of the voltage level of the oscillating signal outputted from X1, the output of the NAND gate NAND1 is the high voltage $V_{DDext}$. The inverter I3 complements this signal and produces a steady low voltage ($V_{SS}$) output signal. Thus, in this state, the oscillator is full disabled.

Consider now the case where pd is a high voltage (e.g., $V_{DDint}$). In this case, transistor P4* is completely off and no conduction path is provided through transistor P4* from the $V_{DDext}$ bus to the output of the NAND gate NAND1. However, transistor N4 is on thereby providing a conduction path from the drain of N2 to the output of the NAND gate NAND1. Thus, when the amplitude of the oscillating signal outputted from X1 is higher than a certain threshold, P2* is off but N2 is on and conducting. As such, the output of the NAND gate NAND1 is driven to $V_{SS}$ via transistors N2 and N4. When the amplitude of the oscillating signal is a low voltage level (e.g., $V_{SS}$), the transistor N2 is off and no conduction path from the $V_{SS}$ bus to the output of the NAND gate NAND1 is provided. However, the transistor P2* is on and drives the output of the NAND gate NAND1 to $V_{DDext}$. Thus, when pd is a high voltage level, the NAND gate NAND1 functions like an inverter. Again, P2* serves as a pull-up driver and N2 serves as a pull-down driver.

Figure 12:
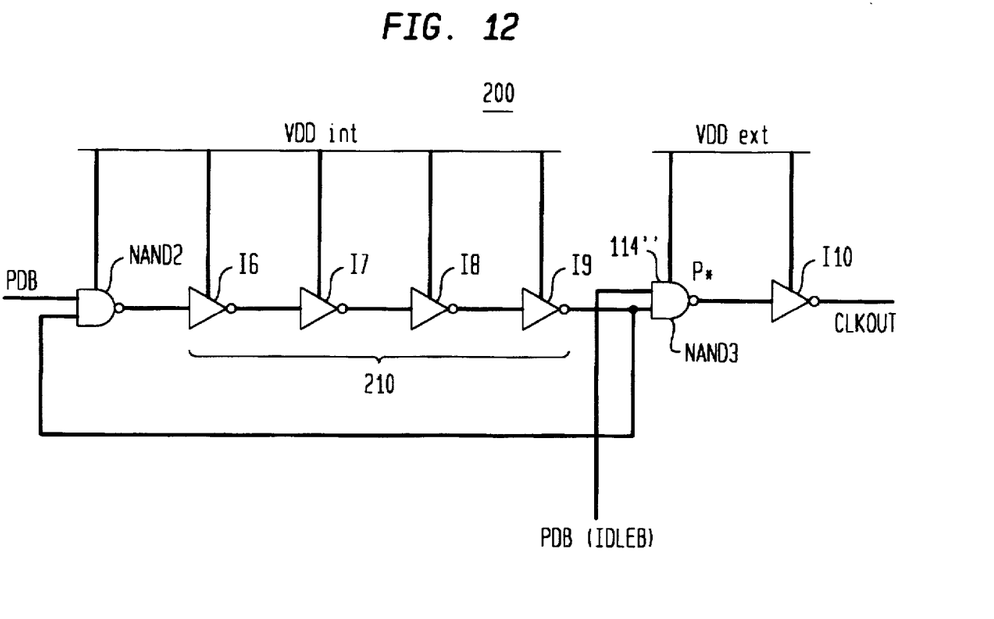
FIG. 12 shows an oscillator circuit according to a sixth embodiment of the present invention.

FIG. 12 shows a ring oscillator 200 according to an embodiment of the present invention. Unlike the oscillators 100-104, the ring oscillator 200 does not have an external resonant circuit and does not include a crystal. Instead, the ring oscillator 200 has an oscillator formed by a two-input NAND gate NAND2 and a delay element 210. The delay element 210 is formed by series connected inverters I6, I7, I8 and I9. The output of the delay element 210 is fed back as one input to the NAND gate NAND2. Illustratively, the second input is a first enable signal PDB.

To reduce the power dissipated by the ring oscillator 200, the ring oscillator 200 receives as a high biasing voltage the voltage $V_{DDint}$. The voltage $V_{DDint}$ may be formed from the higher level voltage $V_{DDext}$ using a reference voltage circuit as described above.

To boost the outputted oscillating signal to the requisite voltage level (without impressing a d.c. component thereon) a level shifter circuit 114" is provided. The level shifter 114" can be formed using a similar architecture as shown in FIG. 11. As shown, the level shifter 114" includes a NAND gate NAND3 which receives the output of the delay element 210 as one input. A second enable signal PDB(IDLE) is received as a second input. The NAND gate NAND3 illustratively includes at least one intrinsic MOS device so as to refrain from introducing a d.c. component into the signal outputted from the NAND gate NAND3. The output of the NAND gate NAND3 is inputted to an inverter I10. The output of the inverter forms the outputted signal. The NAND gate NAND3 and the inverter I10 receive the voltage $V_{DDext}$ as a high biasing voltage.

In operation, when the first enable signal PDB is at a low voltage ($V_{SS}$), the output of the NAND gate NAND2 is always a high voltage, regardless of the voltage of the second input to the NAND gate NAND2 (the output signal of the delay element 210 fed back to the NAND gate NAND2). On the other hand, when the first enable signal PDB is at a high voltage ($V_{DDint}$), the NAND gate NAND2 functions as an inverter For instance, suppose that the signal outputted from the delay element 210 is a low voltage signal. The NAND gate NAND2 outputs a high voltage signal. The high voltage signal propagates through the delay element 210 over a predetermined delay period and thereafter appears at the output of the delay element 210. The high voltage signal is then fed back to the NAND gate NAND2 which outputs a low voltage signal. The low voltage signal then propagates through the delay element 210 during a predetermined delay and is produced at the output of the delay element 210, and so on. Thus, an oscillating signal is produced having a frequency as determined by the delay period of the delay element 210 and the NAND gate NAND2.

The oscillating signal outputted from the delay element 210 is also received at the NAND gate NAND3. When the second enable signal PDB(IDLE) is a low voltage, the NAND gate NAND3 outputs a high voltage signal, regardless of the voltage of the oscillating signal. As such, the signal produced at CLKOUT is a low voltage whenever PDB(IDL) is a low voltage. When the PDB(IDLE) is at a high voltage, the NAND gate NAND3 functions like an inverter. Thus, the oscillating signal is inverted by the NAND gate NAND3 and level shifted. The level shifted, inverted signal is inverted again by inverter I10 to produce a level shifted, non-inverted oscillating signal.

The use of two separate enable signals provides the ability to completely disable the oscillating signal produced by the NAND gate NAND2 and the delay element 210 using PDB. On the other hand, the generation of the oscillating signal can be enabled but its level shifting and output can be disabled using PDB(IDLE).

Finally, the above-discussion is intended to be merely illustrative of the invention. Numerous alternative embodiments may be devised by those having ordinary skill in the art without departing from the spirit and scope of the following claims.

The claimed invention is:

1. A low power consumption oscillator circuit comprising:
a reference circuit which responds to a first voltage by producing a second voltage having a level that is lower than a level of said first voltage, an oscillator which responds to said second voltage by producing an oscillating signal at its output having an amplitude that depends on said second voltage level, and a level shifter comprising a pull-up driver and a pull-down driver connected in parallel between said oscillator output and an output of said level shifter, said pull-up driver being configured so as to refrain from conducting current between a biasing input of said pull-up driver and said level shifter output simultaneously as said pull-down driver when said oscillating signal exceeds a certain voltage level.

2. The oscillator circuit of claim 1 wherein said pull-up and pull-down drivers comprise transistors and wherein a size of said transistors is selected to increase an operating speed of said oscillator circuit.

3. The oscillator circuit of claim 1 wherein by refraining from conducting current between a biasing input of said pull-up driver and said level shifter output simultaneously as said pull-down driver when said oscillating signal exceeds a certain voltage level, said configuration of said pull-up driver also reduces a d.c. component introduced into a signal driven onto said level shifter output.

4. The oscillator circuit of claim 3 wherein by reducing said d.c. component introduced into a signal driven onto said level shifter output, said configuration of said pull-up driver reduces a power consumption in producing a signal outputted from said level shifter output.

5. The oscillator circuit of claim 1 wherein said pull-up driver configuration comprises an intrinsic MOS device.

6. The oscillator circuit of claim 1 wherein said level shifter comprises:

a plurality of series connected inverters connected in series between said oscillator output and said level shifter output, wherein one of said inverters comprises a PMOS transistor and an NMOS transistor connected in parallel and wherein said PMOS transistor is an intrinsic MOS device.

7. The oscillator circuit of claim 1 wherein said level shifter comprises:

a two-input logic gate having a first input connected to said output of said oscillator and a second input connected to a control signal and an output, wherein said two-input logic circuit further comprises at least one intrinsic PMOS transistor having its gate connected to one of said first and second inputs of said two-input logic gate, and an inverter connected in series between said output of said two-input logic gate and said output of said level shifter output.

8. The oscillator circuit of claim 7 wherein said two-input logic gate is a NOR gate, said NOR gate comprising:

a first intrinsic PMOS transistor having a gate connected to said oscillator output, a source, receiving as a first biasing voltage said first voltage, and a drain, a second intrinsic PMOS transistor having its source connected to said drain of said first intrinsic PMOS transistor, a gate receiving said control signal and a drain, a first NMOS transistor having a drain connected to said drain of said second PMOS transistor, a gate connected to said oscillator output and a source, receiving a second biasing voltage having a level lower than said second voltage level, and a second NMOS transistor having a drain connected to said drain of said second PMOS transistor, a gate receiving said control signal and a source receiving said second biasing voltage, wherein said common connection of said drains of said first and second NMOS transistors and said drain of said second PMOS transistor is connected to an input of said inverter.

9. The oscillator circuit of claim 7 wherein said two-input logic circuit is a NAND gate, said NAND gate comprising:

a first intrinsic PMOS transistor having a gate connected to said oscillator output, a source, receiving as a first biasing voltage said first voltage, and a drain, a second intrinsic PMOS transistor having a gate receiving said control signal, a source, receiving as said first biasing voltage said first voltage, and a drain, a first NMOS transistor having a drain connected to said drains of said first and second PMOS transistors, a gate receiving said control signal and a source, and a second NMOS transistor having a gate connected to said oscillator output, a drain connected to said source of said first NMOS transistor and a source connected to a second biasing voltage having a voltage level lower than said second voltage level, wherein said common connection of said drains of said first and second PMOS transistors and said first NMOS transistor is connected to an input of said inverter.

10. The oscillator circuit of claim 1 wherein said reference circuit comprises:

a diode connected between a bus supplying said first voltage and a high voltage biasing input of said oscillator.

11. The oscillator circuit of claim 1 wherein said reference circuit comprises:

a diode connected MOS transistor having a source receiving said first voltage and a drain connected to a high voltage biasing input of said oscillator.

12. The oscillator circuit of claim 1 further comprising:

enable circuitry connected to an output of said oscillator, a feedback input of said oscillator and a bus supplying a low biasing voltage having a voltage level that is lower than said second voltage level, said enable circuitry responding to at least one control input by producing a high disabling resistance path between said oscillator feedback input and said oscillator output and a second conducting path between said low biasing voltage and one of said oscillator output and said oscillator feedback input.

13. The oscillator circuit of claim 7 further comprising:

a control signal generating circuit receiving an enable signal, said second voltage at a high voltage biasing input and having a voltage level that is lower than said second voltage level at a low voltage biasing input, said control signal generating circuit being configured to level shift said enable signal and output said level shifted signal as said control signal.

14. A low power consumption oscillator circuit comprising:

an oscillator which produces an oscillating signal at its output having an amplitude that depends on a voltage level of a particular received high biasing voltage, and a level shifter comprising an intrinsic MOS device which responds to said oscillating signal by outputting a second oscillating signal having an amplitude that is greater than said amplitude of said oscillating signal.

15. An oscillator circuit comprising:

a delay element having a high biasing voltage input receiving a first voltage, a first two-input logic gate having a high biasing voltage input receiving said first voltage, said first two-input logic gate receiving an enable signal as a first input and an output of said delay element fed back as a second input, said first two-input logic gate having an output connected to an input of said delay element, and a second two-input logic gate having a high biasing voltage input receiving a second voltage having a level that is higher than a level of said first voltage, said second two-input logic gate receiving said output of said delay element as a first input and a second enable signal as a second input.

16. The oscillator circuit of claim 15 further comprising:

an inverter connected to an output of said second two-input logic gate having a high biasing voltage input receiving said second voltage.

17. A method for producing an oscillating signal comprising:

producing an oscillating signal having an amplitude that depends on a level of a particular received high biasing voltage, and level shifting said oscillating signal to an amplitude greater than said particular high biasing voltage level using a pull-up driver and a pull-down driver, said step of level shifting further comprising the step of refraining from conducting current between a biasing input of said pull-up driver and said level shifter output simultaneously as said pull-down driver when said oscillating signal exceeds a certain voltage level.

* * * * *